United States Patent [19]

Chall, Jr.

[11] Patent Number: 4,955,131

[45] Date of Patent: Sep. 11, 1990

[54] METHOD OF BUILDING A VARIETY OF COMPLEX HIGH PERFORMANCE IC DEVICES

[75] Inventor: Louis Edmond Chall, Jr., Costa Mesa, Calif.

[73] Assignee: Ford Aerospace Corporation, Newport Beach, Calif.

[21] Appl. No.: 358,316

[22] Filed: May 30, 1989

Related U.S. Application Data

[62] Division of Ser. No. 118,362, Nov. 6, 1987, Pat. No. 4,858,072.

[51] Int. Cl.$^5$ .............................................. H05K 3/36
[52] U.S. Cl. ........................................ 29/830; 29/825
[58] Field of Search ................... 29/832, 890, 825, 830

[56] References Cited

PUBLICATIONS

The Impact of Silicon interconnect Technology on the Design Engineer by C. C. Perkins Sr. et al. IEEE Conf. 1987, Electro /87 & Minr/Micro Northeast, pp. 36/2/ 1–4.
Diserete Wafer Scale Integration by R. R. Johnson, Water Scale Integration, Proc of the IFIP WG 10.5 Workshop, pp. 345-352, 1986 ed by G. Sancier et al.
Silicon-on-Silicon Hybrids are Coming Into Their Own by Jerry Lyman, *Electronics* May 1987, N60, p. 11 N47(2).
Mosaic, A Modulas Architecture for VLSI System Circuits by J. Alves Conference: VLSI81, Very Large Scale Integration, Proceedings 8/18-21/81, pp. 53-61.

*Primary Examiner*—Carl E. Hall
*Assistant Examiner*—Carl J. Arbes
*Attorney, Agent, or Firm*—Harry G. Weissenberger; Edward J. Radlo; Keith L. Zerschling

[57] ABSTRACT

A novel packaging system for VLSI circuits allows low-cost construction and maintenance of complex high density high-performance devices with low power requirements. The devices can be individually created by software means from a small selection of standardizable IC chips by disposing a plurality of chips in leadless chip carriers in a mosaic on a substrate, and configuring them by software to selectively communicate with other chips of the mosaic or even to individually change their operating function. The immediate juxtaposition of the chip carriers in the mosaic eliminates transmission line data skew, and also allows considerable savings in chip space and power requirements by dispensing with interconnection drivers, receivers and bonding pads. The chip carrier mosaics may be assembled into modules suitable for plug-in connection to an interconnecting backplane to create even larger devices, and individual modules can be dynamically tested in their high-performance mode by configuring one or more modules as test modules and either plugging them into modules to be tested or making them a permanent part of the device's module array.

3 Claims, 7 Drawing Sheets

METHOD OF BUILDING A VARIETY OF COMPLEX HIGH PERFORMANCE IC DEVICES

This is a divisional application of application Ser. No. 118,362, filed Nov. 6, 1987, which issued as U.S. Pat. No. 4,858,072 on Aug. 15, 1989.

FIELD OF THE INVENTION

This invention relates to integrated circuits, and more particularly to a packaging system which eliminates the adverse effects of long transmission lines and of the resulting data skew, and which allows a wide variety of very large scale integrated circuits for very high performance electronic devices to be built from a small selection of standard modules containing only a few types of standard chips.

BACKGROUND OF THE INVENTION

The proliferation of VLSI (very large scale integration) chips for the miniaturization of complex electronic equipment has brought about new kinds of problems which tend to defeat the advantages of VLSI technology. Among others, these problems include: (1) the large number of terminals associated with VLSI chips produces complex, expensive circuit board layouts and long interconnection lines which in turn cause skew problems and require high power consuming, heat-generating drivers; (2) a failure in any part of the chip usually makes the whole chip inoperative; and (3) the vast number of specialized chips available on the market results in uneconomical short runs and makes it difficult for designers to keep up with what the market has to offer.

Prior art in this field includes U.S. Pat. No. 3,611,317 which deals with printed circuit board layouts but does not teach elimination of long IC interconnections nor a universal board configuration; U.S. Pat. No. 4,107,760 which shows a flat peripheral heat sink for a circuit board which does not encounter the thermal expansion compensation problems solved by this invention; U.S. Pat. No. 4,246,597 which shows an add-on device for cooling a multi-chip module; U.S. Pat. No. 4,296,456 which deals with a high-bandwidth IC package but does not show the leadless I/O serial data connection scheme of this invention; U.S. Pat. No. 4,398,208 which deals with an IC package that uses a multilayer substrate but does not have the leadless interconnection feature of this invention; U.S. Pat. No. 4,437,141 which deals with outside-world connections for large terminal count IC chips; U.S. Pat. No. 4,484,215 which deals with a flexible mounting support for immersion cooling of wafer scale IC's; U.S. Pat. No. 4,489,363 which deals with a cooling method not suited to high density IC packaging; U.S. Pat. No. 4,549,200 which deals with a multi-level modular approach not suited to the leadless packaging of this invention; U.S. Pat. No. 4,551,746 which relates to a stacked chip array; and U.S. Pat. No. 4,578,697 which deals with a packaging method using printed-circuit-type interconnections.

SUMMARY OF THE INVENTION

The invention overcomes the problems of the prior art by providing a packaging scheme that uses standardizable modules carrying planar mosaics of many integrated circuit chips which may be selected from a very small variety of standardizable IC chips. The individual chips, which are leadlessly interconnected and have no need for high-powered drivers, are then combined by software techniques into large-scale arrays of any desired configuration, in which the interface and communications protocol are standardized for all chips. Modules can in turn be interconnected by fiber optic and electrical connectors to create very high performance electronic devices of any desired size and architecture which can be tested on a module-by-module basis.

The multiple chip interfaces provide fault tolerance capability. Because the chip mosaic provides many possible paths from one chip to another, each mosaic can easily be programmed to take a defective chip out of the circuit with little or no effect on the overall device.

The individual chips are mounted on leadless carriers which can take various geometric forms; although hexagons are preferred, the carrier geometry of this invention is equally applicable to squares, rectangles or any other carrier shapes which have a plurality of sides interfacing with sides of several adjacent carrier chips.

The leadless interconnection scheme of this invention is made possible in part by providing, in conjunction with each set of leadless interconnections, a serializing-/deserializing interface which greatly reduces the number of interconnections needed from chip to chip. In the preferred embodiment of the invention, each set of interconnections requires only three connection pads: a high-speed incoming data connection pad, a high-speed outgoing data connection pad, and a low-speed bidirectional configuration signal connection pad. The serializing/deserializing interfaces are preferably formed of gallium arsenide for high-speed operation.

Another aspect of the invention is the provision of highly effective cooling means in the form of a corrugated sheet of thermally and electrically conductive material with interdigitated slots. When the sheet is soldered to a ground plane of the module, the slots allow the sheet to accommodate the different expansion coefficient of the ground plane substrate. At the same time, the electrical conductivity of the sheet enhances the power-carrying capacity of the ground plane.

DESCRIPTION OF THE PREFERRED EMBODIMENT

Figure 1:
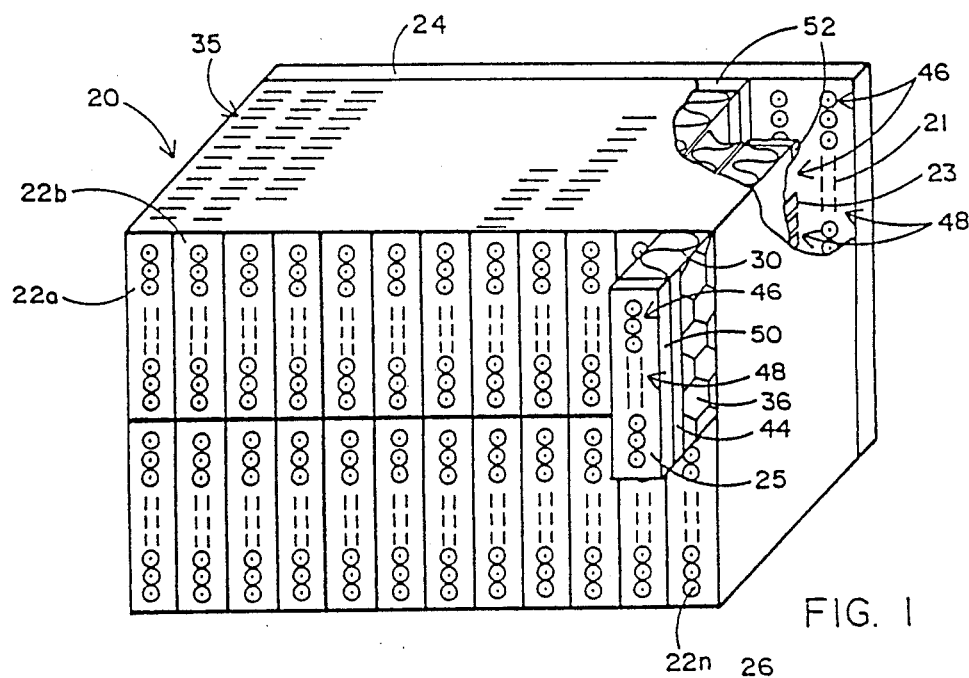
FIG. 1 is a perspective, partially cut away view of a module rack having a backplane and carrying a plurality of the process modules of this invention, one of the modules being partially pulled out to show detail.

FIG. 1 shows a module rack 20 in which any number of process modules 22a, 22b through 22n may be plugged into the female connectors 21 of a backplane 24 by male connectors 23 to form a specific electronic device. The backplane 24 contains the fiber optic and electric interconnections (not shown) necessary to connect each of the modules 22a through 22 n to one or more of the other modules 22a through 22n in such a manner as to create whatever hard-wired array of modules 22 the particular device may require.

The end 25 of each module opposite the backplane 24 is equipped with a set of fiber optic and female electrical connectors which allows a test module (not shown) structurally similar to the modules 22 but software-configured as a test module to be plugged into it end-to-end for the dynamic testing of each individual module. Due to the extremely high operating speeds of which the system of this invention is capable, conventional test equipment may not be suitable. Instead, known data may be generated by the device, and the data stored in the test module as a result thereof may be used as a diagnostic tool in evaluating the performance of the tested module. Alternatively, one or more of the modules 22a through 22n may be programmed to function as permanent test modules connectable to appropriate evaluation equipment.

Figure 2:
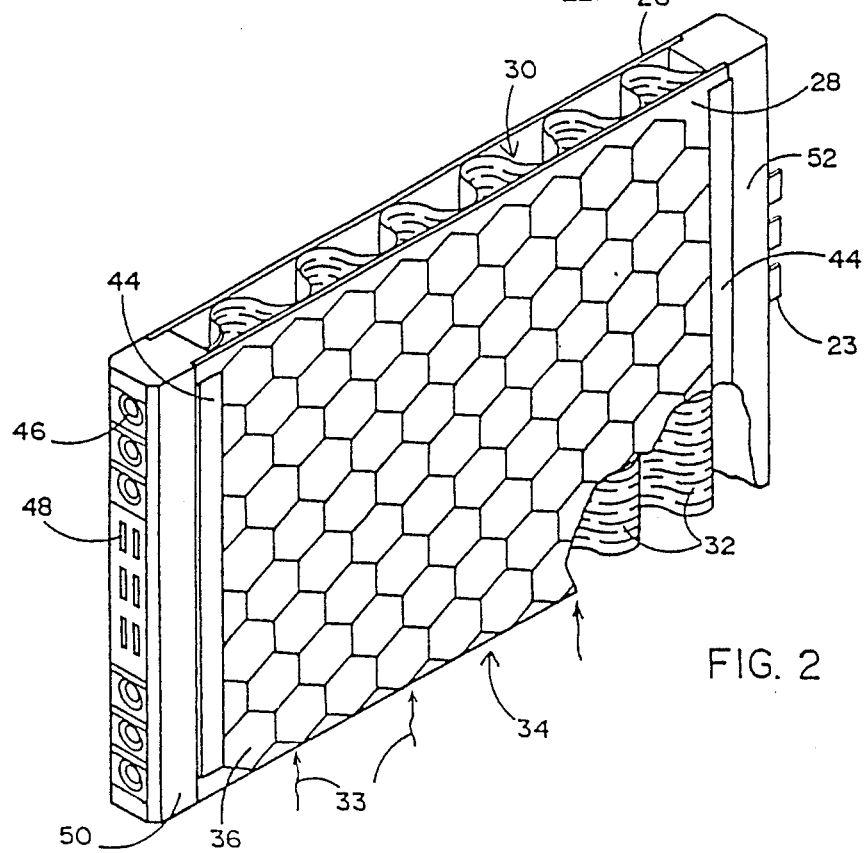
FIG. 2 is an enlarged perspective view, partially cut away, of a single process module.

An individual process module 22 of this invention is shown in more detail in FIG. 2. The module 22 consists of a pair of parallel circuit boards 26, 28 which are reflow soldered to a heat sink structure 30. The heat sink structure 30 preferably consists of a corrugated, highly heat-conductive and electrically conductive material which has a large number of interdigitated saw kerfs or apertures 32 formed therein to allow for the different coefficient of expansion of the circuit boards 26, 28 in the vertical direction in FIG. 2. Air or coolant can flow through the heat sink structure 30 in the direction of arrows 33, and out of the FIG. 1 rack through ventilation grille 35 or other suitable circulation means. The heat sink structure also provides additional current-carrying capacity for the ground plane 60 (FIG. 4) of the circuit boards 26, 28.

As best shown in FIG. 2, the circuit boards 26, 28 carry a mosaic of hexagonal chip carriers 36 (eighty-one per board in the embodiment shown in FIG. 2). The chip carriers 36 are shown in more detail in FIGS. 5 through 7. As best illustrated in FIG. 10, the individual chip carriers 36 of the mosaic 34 are placed in immediate adjacency to each other (typically less than 0.1 mm apart). They are interconnected by reflowing solder from microstrips 38 (FIG. 9) into the generally cylindrical tube 40 formed by the opposing semicylindrical connection pads 42 of adjacent chip carriers 36.

Coming back to FIG. 2, a driver strip 44 may be placed at each end of the mosaic 34 to contain the receivers and drivers for the outside-world fiber optic connectors 46 and electrical connectors 48 located in the female and male connector blocks 50, 52, respectively. Alternatively, the fiber optic drivers and receivers may be incorporated in special chip carriers 36 which are part of the mosaic 34 but which must then be placed in specific positions and specific orientations to match positions for optical fibers in the circuit boards 26, 28. Six fiber optic connectors 46 and six electrical connectors 48 have been shown in FIG. 2 for drawing clarity, but it will be understood that their number may vary as dictated by design considerations.

Figure 3:
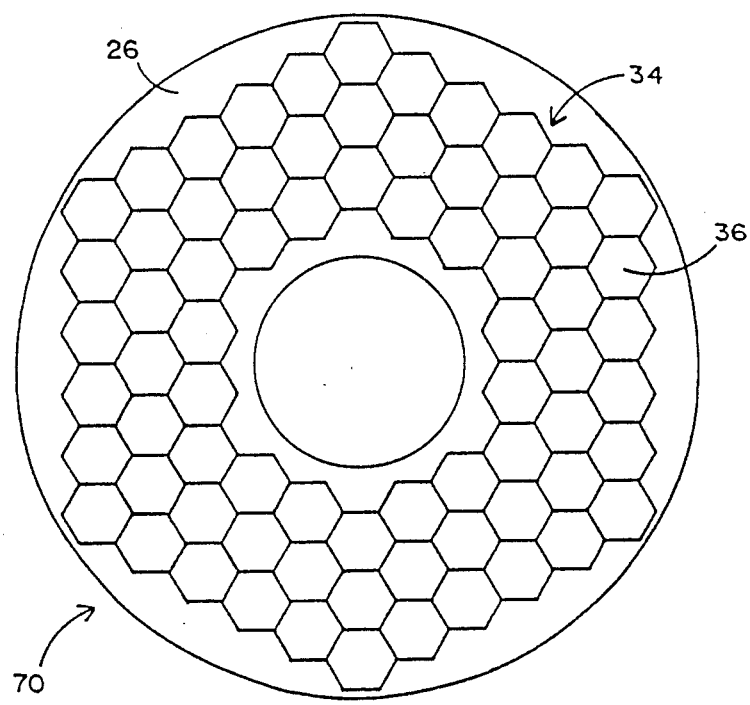
FIG. 3 is a plan view of an alternative embodiment of the module of FIG. 2.

Although the invention has so far been described in terms of card-like modules 22 (FIGS. 1 and 2) suitable for insertion into a rack 20 for plug-in connection to a backplane 24, the modules of this invention may be carried out in other configurations such as, for example, the circularly configured module 70 of FIG. 3. In that configuration, the fiber optic and electrical connectors (not shown) of the module 70 may be on the rim of module 70 or at some other convenient location.

Figure 4:
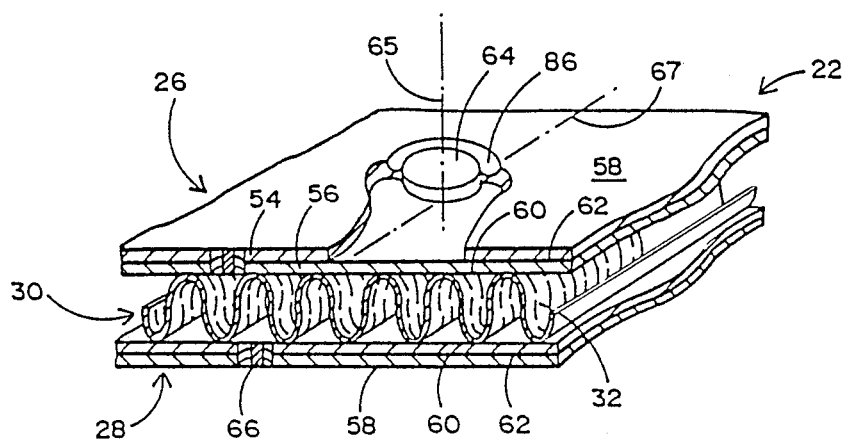
FIG. 4 is a detail cut-away perspective view of a portion of the circuit board assembly of the module of FIG. 2.

The circuit boards 26, 28 are shown in more detail in FIG. 4. Each of the boards 26, 28 consists of two insulating layers 54, 56 preferably composed of aluminum nitride which separate a pair of conductive ground planes 58, 60 from a conductive power plane 62. In the center of each chip position of the mosaic 34 (FIG. 2), the ground plane 58 is cut out to allow a solder pad 64 electrically connected to the power plane 62 to protrude through the ground plane 58. The ground plane 60 is soldered to the heat sink 30, and the solder pads 64 are preferably centered (line 65) along the solder lines (indicated by dot-dash line 67 in FIG. 4) connecting the heat sink 30 and the ground plane 60 on each side of the module 22. The ground planes 58, 60 are connected to each other by connector pins 66.

Figure 5:
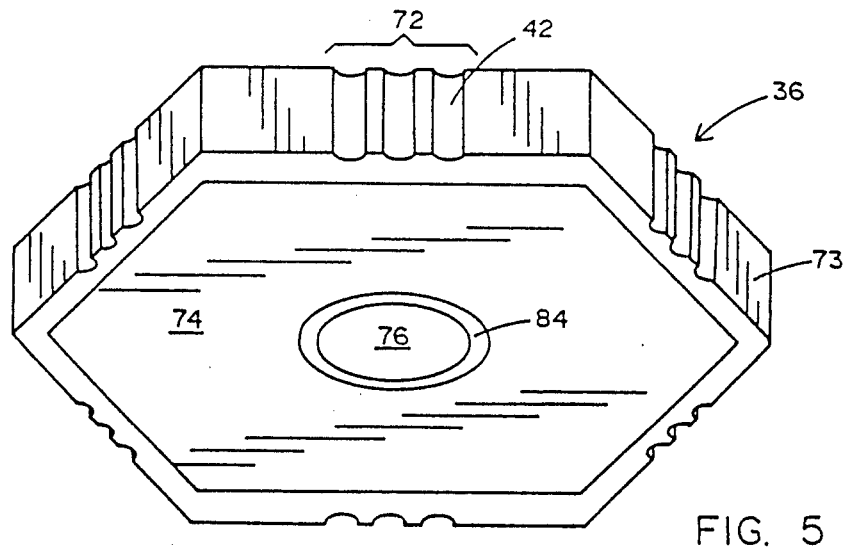
FIG. 5 is a bottom perspective view of a single chip carrier of the module of FIG. 2.
Figure 6:
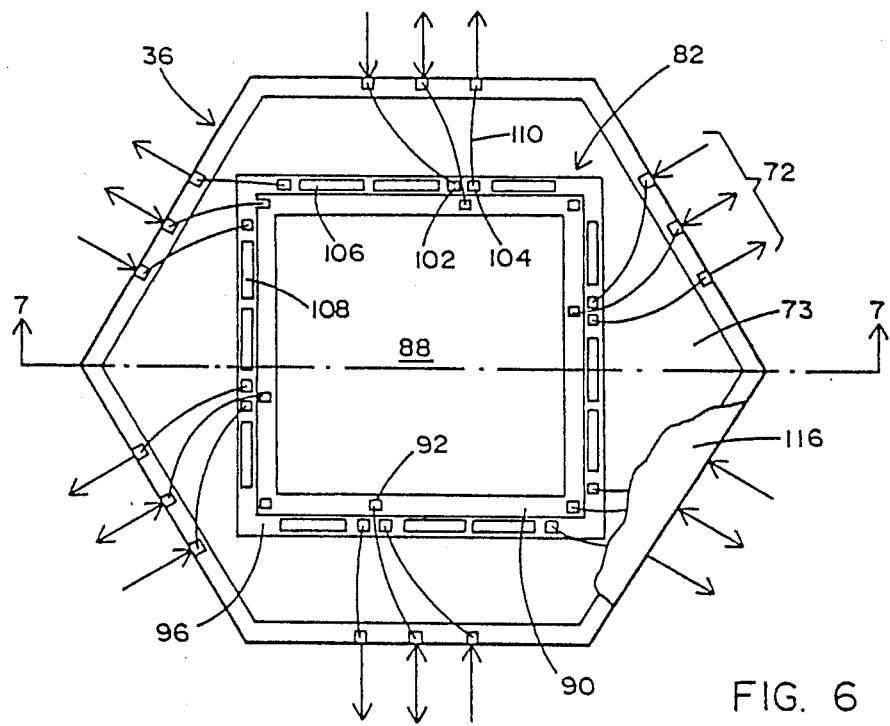
FIG. 6 is a top plan view of the chip carrier of FIG. 5 showing details of portions of the chip.
Figure 7:
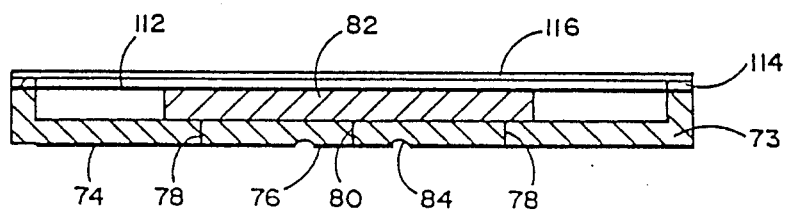
FIG. 7 is a vertical section along line 7—7 of FIG. 6.

FIGS. 5 through 7 illustrate the leadless chip carriers 36 which form the mosaic 34. In the preferred embodiment, the chip carriers 36 are hexagonal in shape because a hexagonal mosaic is efficient and easy to assemble (and also tends to align itself during reflow soldering), but other mosaics may also be used as shown in FIGS. 12a through 12d.

In this respect, it should be noted that from an assembly point of view, the orientation of any individual chip carrier 36 is immaterial, as its connection pad sets 72 will always match the positions of every adjacent carrier's connection pad sets. Tha same is true of the arrangement of FIG. 12a (which however requires eight connection pad sets per carrier instead of six); that of FIG. 12b (in which each carrier has only two possible orientations); and that of FIG. 12c (in which each chip can communicate with only four other chips instead of six). By contrast, in the arrangement of FIG. 12d, two of the four possible orientations of any carrier would result in a mismatch, so that more care would have to be exercised in assembly.

Returning now to FIG. 5, the chip carrier 36 includes a tray-shaped body 73 for receiving an integrated circuit chip. As a matter of general reference, the body 73 may have a diameter on the order of one centimeter. As seen from the bottom in FIG. 5, the body 73, which is preferably made of aluminum nitride, has a metallic ground plate 74 which is reflow soldered to the ground plane 58 (FIG. 4) of the module 22. The ground plate 74 is spaced from the semicylindrical metallic connection pads 42 which extend upwardly from the base. It is also cut out in the center to form a metallic power connector plate 76 which is reflow soldered to the power pad 64 of FIG. 4. Connections 78, 80 (FIG. 7) extend from the ground plate 74 and power connector plate 76 through the body 73 to appropriate contacts on the integrated circuit chip die 82 mounted in the cavity of body 73.

Figure 8:
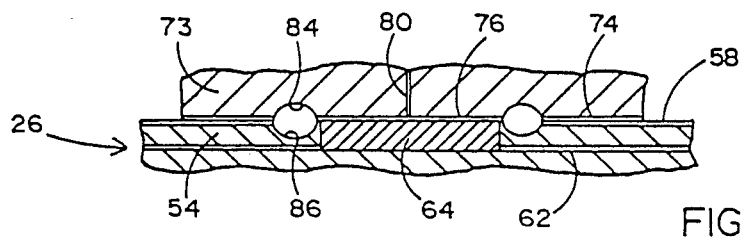
FIG. 8 is a detail vertical section through a chip carrier and the substrate of the module of FIG. 2 along a diameter of the chip carrier.

As shown in FIG. 8, a ring-shaped depression 84 formed in body 73 opposite a similar depression 86 in the substrate 54 of the circuit board 26 or 28 (FIG. 4) is preferably provided to prevent solder from flowing across the gap between ground plate 74 and power connector 76.

FIG. 6 shows the details of the chip die 82 and its interconnection with the connection pad sets 72. The die 82 carries in its center a processor, memory, or other function circuit 88 capable of being statically and dynamically configured, through multiplexers and electronic switches, to receive data from a selected set of connection pad sets 72, carry out a computational function, and transmit data through the same or another selected set of connection pad sets 72. If the circuit 88 is to serve merely as a transit path for the data without performing any computational function, multiplexers in the circuit 88 can be set to route data directly from one set of connection pad sets 72 to another with minimum delay. The manner in which this is done will be discussed in more detail in the description of FIG. 11. In the preferred embodiment of the invention, each connection pad set 72 contains three contacts 42 (FIG. 5), one of which handles incoming high-speed data, another outgoing high-speed data, and the third bidirectional slow-speed configuration signals.

Figure 11:
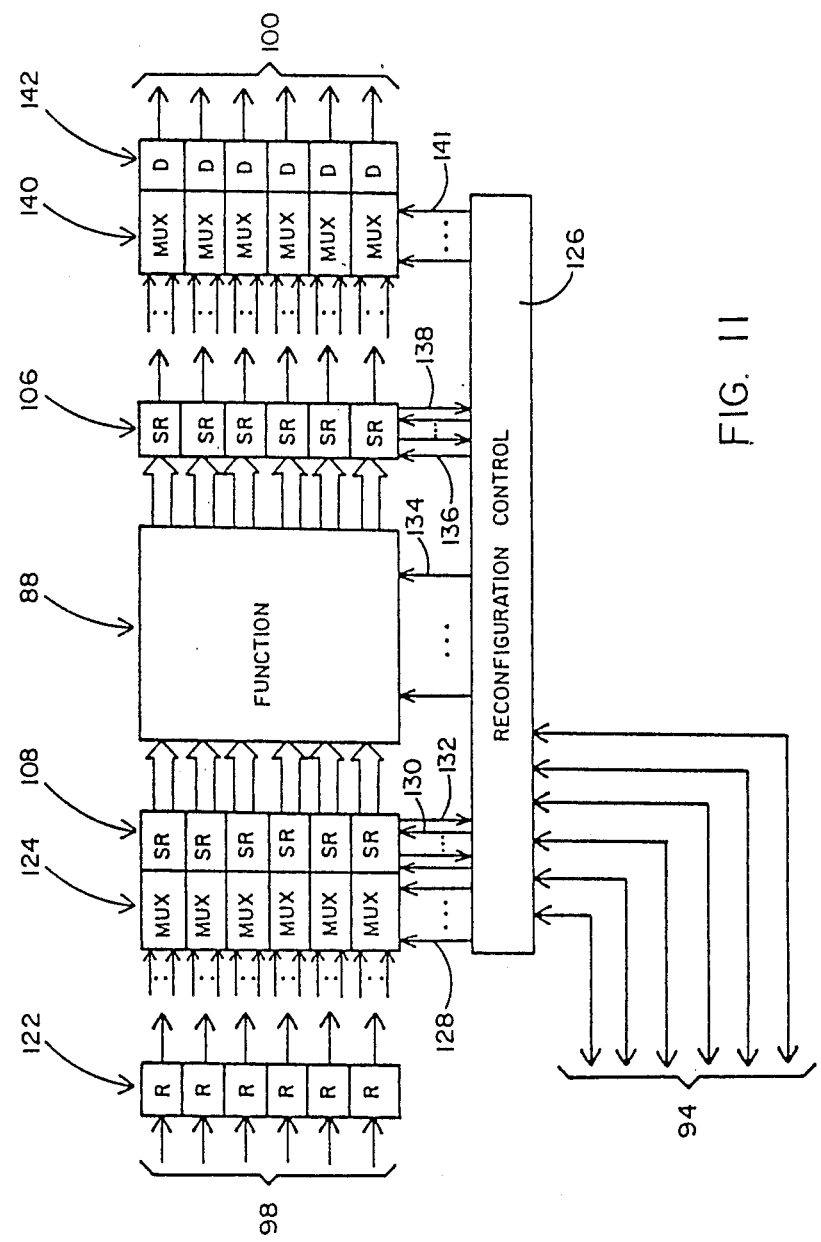
FIG. 11 is a block diagram of the configuration circuitry of the chip of FIG. 6.
Figure 12C:
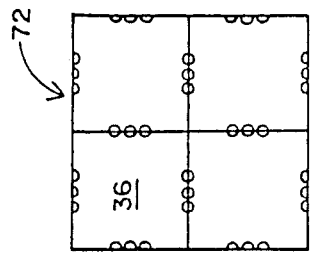
FIGS. 12a through 12d illustrate various possible mosaics of chip carriers.
Figure 12B:
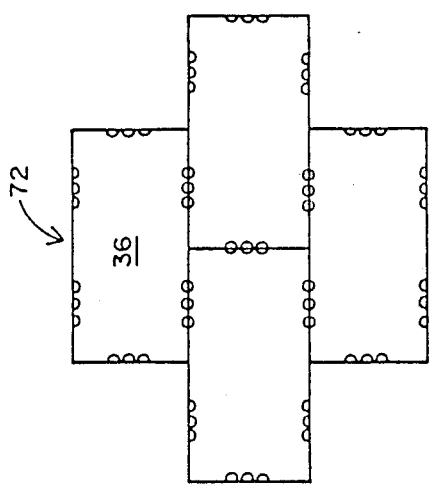
Figure 12D:
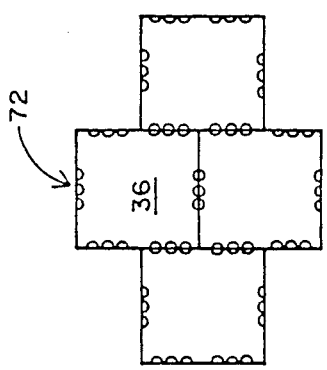
Figure 12A:
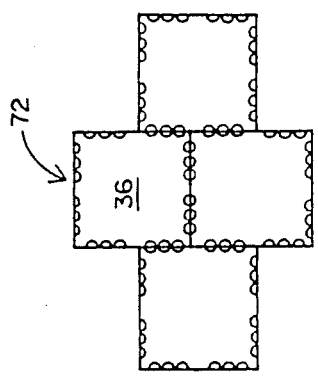

Surrounding the function circuit 88 are a voltage impedance interface 90 with contacts 92 for the slow-speed static configuration input/output 94 of FIG. 11, and a high-speed data interface 96 which serves as the data input/output 98, 100 of FIG. 11. The high-speed data circuitry carries clock and data signals simultaneously for each connection pad set 72 (at which the arrows indicate the direction of signal travel), the interface 96 carries a corresponding set of contacts including an input contact 102 and an output contact 104. In accordance with one aspect of the invention, the interface 96 also carries a serializing shift register 106 and a deserializing shift register 108 for each set of interconnections 72. If the function circuit 88 is a parallel device, as it would usually be in high-density high performance systems, serializing the chip-to-chip connections allows the number of connection pads 42 in each set of interconnections 72 to be reduced to a manageable number, considering the small physical size of the chip carriers 36.

For high-performance devices, it is desirable to form at least the high-speed interface 96 and possibly the function circuit 88 of gallium arsenide alone, or of gallium arsenide grown on a silicon base. The silicon provides a superior thermal path for heat transfer out of the circuit die 82. For lower speed devices, however, silicon alone would be a satisfactory material.

In accordance with conventional integrated circuit chip construction, the leads 110, shown schematically in FIG. 6, are embodied in a lead frame 112 (FIG. 7) which is assembled with the die 82 and carrier body 73 by a conventional tape automated bonding assembly process. A separator 114 (FIG. 7) and cap 116 complete the assembly of chip carrier 36.

Figure 9:
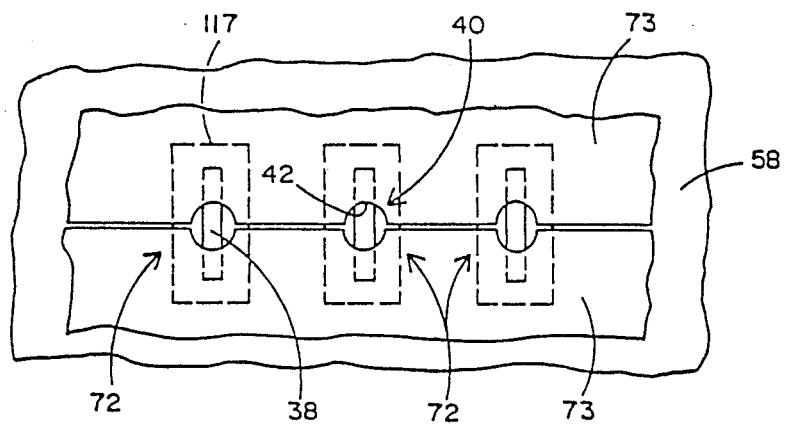
FIG. 9 is a plan view of the circuit board substrate at the connection between two adjacent chip carriers.
Figure 10:
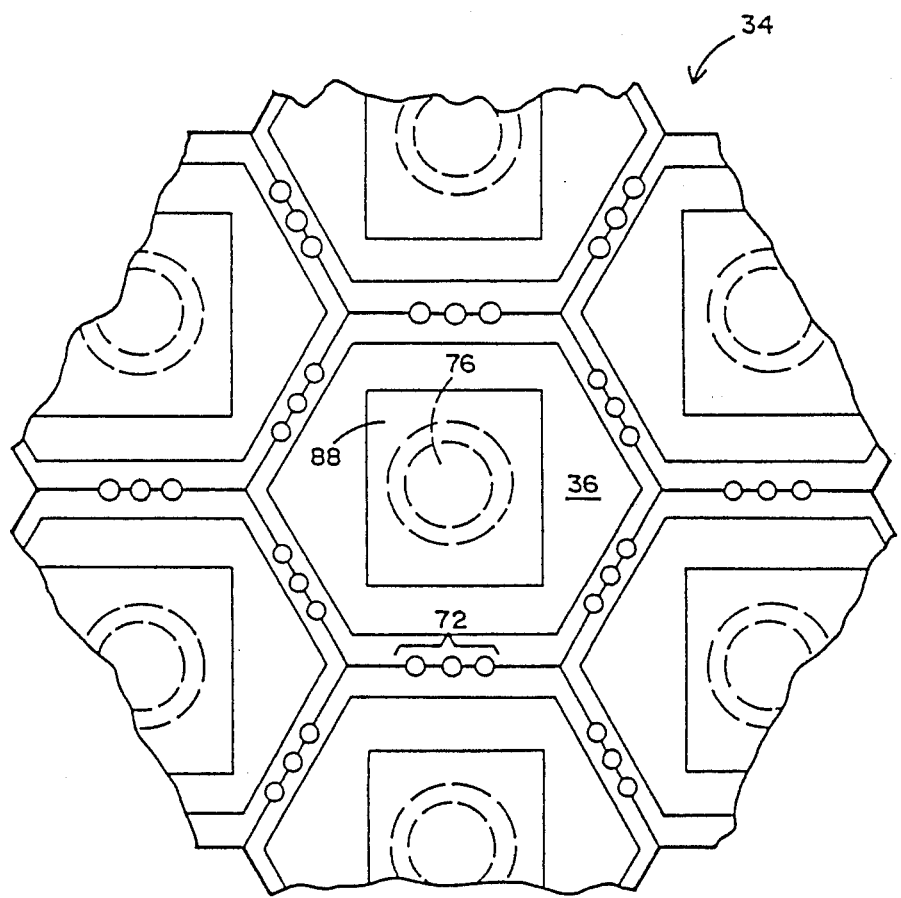
FIG. 10 is a plan view of a portion of a mosaic of chip carriers, with their caps removed, on the module of FIG. 2.

FIGS. 9 and 10 illustrate the assembly of the chip carriers 36 into the mosaic 34. The carriers 36 are placed into the mosaic 34 as shown in FIG. 10, with a gap of about 0.1 mm between them to permit inspection of the solder connections. Underneath each set of connection pad sets 72, the ground plane 58 is cut out as shown at 117 in FIG. 9 to form the solder-covered electrically isolated microstrips 38. When the carriers 36 are in place and the module 22 is reflow soldered, the solder from strips 38 rises in the cylindrical tube 40 formed by opposing connection pads 42 and joins them together both physically and electrically. At the same time, as seen in FIG. 8, the carrier's ground plate 74 and power connector plate 76 are mechanically and electrically joined to the ground plane 58 and power pad 64, respectively, of the circuit board 26 or 28.

FIG. 11 shows, in block form, the organization of each chip 82. In accordance with the invention, the operation of the module 22 involves both a static and a dynamic selection of the configuration of each chip 82. Slow-speed static configuration selection signals are applied to each chip 82 through its six contacts 92 (FIG. 6). These signals establish the basic configuration of the mosaic 34 (usually done during initialization on power-up starting from a known interface) by defining paths which data signals follow as they progress through the mosaic 34. Among other things, this arrangement allows the static configuration of the mosaic 34 to be changed from time to time to route data around any chips 82 which might be defective, without taking the module 22 out of service.

Dynamic configuration of the chip 82 is accomplished by the received hight-speed data itself. Each of the six input contacts 102 of the interface 96 (FIG. 6) is connected at the data input 98 of FIG. 11 to a separate receiver 122 which can be connected to any one of the deserializing shifts registers 108 or drivers 142 to bypass the function circuit 88) by multiplexers 124. The multiplexers 124 are statically configured by the reconfiguration control 126 over lines 128. The shift registers 108 are statically configured by the control 126 over lines 130, and the data received by them is in turn used to operate the control 126 dynamically over lines 132.

The function circuit 88 can be both dynamically and statically configured by control 126 over lines 134 to change the operational architecture of circuit 88 as desired. At the output of circuit 88, the serializing registers 106 interact with control 126 as do shift registers 108, but over lines 136 and 138, respectively, for static and dynamic reconfiguration. The output multiplexers 140 are statically configured by control 126 via lines 141 to connect any given serializing register 106 or receiver 122 to an output driver 142 associated with an output contact 104 (FIG. 6) of the output interface 100 (or with one of the multiplexers 124 of FIG. 11 for reentry into function circuit 88).

It will be seen that the present invention provides a packaging scheme which allows low-cost manufacture and maintenance of highly complex, yet low-power high performance devices requiring only a small selection of simple, enexpensive standardized components which can be quickly configured into any desired form by software alone. In another aspect, the invention provides a communication scheme and a high-performance processor architecture, all based on controlling the configuration of multiple standarizable chips by software techniques. At the same time, the system of this invention eliminates the problem of data skew and delay in VLSI devices by eliminating leads between chip carriers, and makes the devices built with the inventive system easy to test and repair, sometimes without even taking them out of service.

The leadless architecture of the module of this invention permits a power reduction of up to 90% per chip, while the omission of interconnection drivers, receivers and bonding pads saves on the order of 55% of the normally required chip space. The ability of the chip carrier to accomodate up to 1.5 W per chip is thus adequate to house chips which would normally dissipate seven to ten watts, or even up to fifteen watts.

I claim:

1. A method of building a variety of complex high-performance integrated circuit devices from a small selection of standardizable components, comprising the steps of:

(a) assembling plurality of substantially identical chip carriers adjacent to each other onto a common substrate to form a mosaic; wherein each of said carriers comprises:

connection pads so arranged on the periphery of said carrier that each connection pad, except for those connection pads on the periphery of the mosaic, is immediately adjacent to a corresponding connection pad of another carrier of the mosaic; and a software-configurable integrated circuit chip mounted on said carrier; wherein:

said chips, carriers, and mosaic are so configured as to allow each chip to selectively transmit and receive data through said connection pads to and from a chip on any adjacent carrier in said mosaic; and immediately adjacent ones of said connection pads are electrically connected to each other without the use of intervening wires or leads; and (b) configuring said chips by electronic signals to form a very large scale integrated circuit.

2. The method of claim 1, in which said chips are substantially identical.

3. The method of claim 2, in which said chips are selected from a small selection of standardized chips.

* * * * *